(12) United States Patent
Lee et al.

(10) Patent No.: US 7,579,685 B2
(45) Date of Patent: Aug. 25, 2009

(54) WAFER LEVEL PACKAGING CAP AND FABRICATION METHOD THEREOF

(75) Inventors: Moon-chul Lee, Yongin-si (KR); Woon-bae Kim, Suwon-si (KR); Kae-dong Back, Yongin-si (KR); Qian Wang, Yongin-si (KR); Jun-sik Hwang, Yongin-si (KR); Kyu-dong Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 457 days.

(21) Appl. No.: 11/339,500

(22) Filed: Jan. 26, 2006

(65) Prior Publication Data

US 2006/0175707 A1 Aug. 10, 2006

(30) Foreign Application Priority Data

Feb. 4, 2005 (KR) .................... 10-2005-0010647

(51) Int. Cl.
*H01L 23/12* (2006.01)
*H01L 23/043* (2006.01)
(52) U.S. Cl. .................. 257/704; 257/773; 257/774; 257/E23.182
(58) Field of Classification Search ............ 257/704, 257/E23.024, E23.012, E23.175, E23.182, 257/E23.19
See application file for complete search history.

(56) References Cited

U.S. PATENT DOCUMENTS

| 2004/0077154 | A1* | 4/2004 | Nagarajan et al. ........... 438/455 |
| 2004/0259325 | A1 | 12/2004 | Gan |
| 2005/0073040 | A1* | 4/2005 | Lee et al. .................... 257/698 |
| 2007/0004079 | A1* | 1/2007 | Geefay et al. ............... 438/106 |

FOREIGN PATENT DOCUMENTS

| EP | 1071126 A2 | 1/2001 |
| EP | 1199744 A1 | 4/2002 |

* cited by examiner

*Primary Examiner*—David Vu
*Assistant Examiner*—Earl N Taylor
(74) *Attorney, Agent, or Firm*—Sughrue Mion, PLLC

(57) ABSTRACT

A wafer level packaging cap and method thereof for a wafer level packaging are provided. The wafer level packaging cap covering a device wafer with a device thereon, includes a cap wafer having on a bottom surface a cavity providing a space for receiving the device, and integrally combined with the device wafer, a plurality of metal lines formed on the bottom surface of the cap wafer to correspond to a plurality of device pads formed on the device wafer to be electrically connected to the device, a plurality of buffer portions connected to the plurality of metal lines and comprising a buffer wafer with a plurality of grooves and a metal filled in the plurality of grooves, a plurality of connection rods electrically connected to the plurality of buffer portions and penetrating the cap wafer from a top portion of the buffer portion, and a plurality of cap pads formed on a top surface of the cap wafer and electrically connected to a plurality of connection rods.

8 Claims, 10 Drawing Sheets

WAFER LEVEL PACKAGING CAP AND FABRICATION METHOD THEREOF

CROSS-REFERENCE TO RELATED APPLICATIONS

This application claims priority from Korean Patent Application No. 10-2005-010647 filed on Feb. 4, 2005, in the Korean Intellectual Property Office, the disclosure of which is incorporated herein by reference in its entirety.

BACKGROUND OF THE INVENTION

1. Field of the Invention

The present invention relates to a wafer level packaging of a semiconductor chip. More particularly, the present invention relates to a wafer level packaging cap for the wafer level packaging and fabrication method thereof.

2. Description of the Related Art

Generally, devices manufactured as a chip unit and performing certain functions are extremely vulnerable to damage from moisture, small particles, and high temperature, and therefore, need to be packaged. Examples of the devices include microscopic mechanisms such as Integrated Circuit (IC), Hybrid chip for communication, Radio Frequency Micro Electro Mechanical System (RF MEMS), and an actuator. For the package, a top surface of a device wafer with a device performing certain functions is covered and hermetically sealed with a cap having a cavity providing a space capable of receiving the device. A "wafer level packaging" means that, prior to dicing the wafer with a plurality of devices into individual chips, the wafer is hermetically sealed and packaged with a packaging cap to form a wafer unit and diced into individual chips. The wafer level packaging is also applied to producing devices such as charge-coupled device (CCD), sensor which needs to minimize exposure to high temperature, moisture, gas materials, and particles. Hereinafter, the packaging cap for the wafer level packaging will be explained as a chip unit for convenience.

FIG. 1 is a view of an example of a chip packaged with a conventional wafer level packaging cap.

Referring to FIG. 1, a packaged chip 1 comprises a device wafer 10 and a packaging cap 20.

The device wafer 10 comprises a device substrate 11, a device 12 formed at a top surface of the device substrate 11 and performing a certain function, and a plurality of device pads 13 electrically connected with the device 12, and is manufactured according to a general semiconductor fabrication process.

The packaging cap 20 comprises a cap substrate 21 having at the bottom surface a cavity 22 of a certain volume providing a space for receiving the device 12 and integrally packaged with the device wafer 10, a plurality of metal lines 25 formed from the bottom surface of the cap substrate 21 to an inner surface 22a of the cavity 22 to correspond to a plurality of the device pads 13 (electrically connected to the device 12), a plurality of connection holes 28 penetrating from the inner surface 22a of the cavity 22 of the cap substrate 21 to the top surface of the cap substrate 21 to correspond to the metal lines 25, a plurality of connection rods 24 formed in the plurality of the connection holes 28, and from the bottom portion electrically connected to the plurality of metal lines 25, and a plurality of cap pads 23 formed at the top surface of the cap substrate 21 and electrically connected to top portions of the connection rods 24 of the plurality of connection holes 28.

A sealing line 14 of the device wafer 10 and a cap sealing line 27 of the packaging cap 20 are melted and bonded by eutectic bonding to complete the packaging of the chip 1.

According to conventional art, however, plenty of damages occur around the connection holes 28 of the packaging cap 20 during a temperature resistance test. This is because of a thermal stress during heating for the temperature resistance test, caused by difference of heat strain ratio between a material of the wafer of the cap substrate 21 forming the connection holes 28 and a material forming the connection rod 24. As such, it is necessary to buffer the stress.

To this end, the plurality of connection holes 28 are manufactured on the cap substrate 21, a buffer material layer is formed on the inner surface of the connection holes 28, and then the connection rods 24 are formed by electroplating. For the electroplating, a seed metal layer needs to be formed on the buffer material layer of the inner surface of the connection holes 28. Generally, it is possible to form the seed metal layer on the inner surface of the connection holes 28 only when the depth of the connection holes is less than 100 µm. In other words, the seed metal layer can be formed only on the connection holes 28 formed in the wafer with the thickness of less than 100 µm. However, the thickness of the completely-manufactured cap substrate 21 must be generally 300 µm or more in view of mechanical characteristics of the wafer and convenience of manufacturing. If the cap substrate 21 is thinner than 300 µm, the wafer may be easily damaged during manufacture process. Accordingly, it is impossible to form the seed metal layer on the connection holes 28 of the cap substrate 21 with thickness of 300 µm or more according to the above method. If the seed metal layer can not be formed, the electroplating can not be performed, and therefore, it is impossible to form the connection rods 24.

According to the conventional fabrication method of the packaging cap, it is difficult to form the buffer material in the connection holes 28 in order to have good features during the temperature resistance test for the wafer with the thickness of 300 µm or more.

SUMMARY OF THE INVENTION

The present invention has been conceived to solve the above-mentioned problems occurring in the prior art, and an aspect of the present invention is to provide a wafer level packaging cap in which damages do not occur at connecting portions between a connection rod and a cap substrate during temperature resistance test, and fabrication method thereof.

Another aspect of the present invention is to provide a wafer level packaging cap and fabrication method thereof which fabricates the connection hole of the wafer with a high aspect ratio (HAR) and more easily fills the connection hole by using an electroplating process.

In order to achieve the above aspects, there is provided a wafer level packaging cap covering a device wafer with a device thereon, comprising a cap wafer having on a bottom surface a cavity providing a space for receiving the device, and integrally combined with the device wafer, a plurality of metal lines formed on the bottom surface of the cap wafer to correspond to a plurality of device pads formed on the device wafer to be electrically connected to the device, a plurality of buffer portions connected to the plurality of metal lines and comprising a buffer wafer with a plurality of grooves and a metal filled in the plurality of grooves, a plurality of connection rods electrically connected to the plurality of buffer portions and penetrating the cap wafer from an top portion of the buffer portion, and a plurality of cap pads formed on a top surface of the cap wafer and electrically connected to plurality of connection rods.

A buffer material layer is formed between the plurality of grooves and the metal, and between the connection rods and the cap wafer. The buffer material layer may be an oxidized layer.

The buffer portion may be greater than the connection rod in cross-section. The buffer portion may have a stripe pattern in cross-section which repeats the metal and the buffer wafer. The metal of the buffer portion may be the same material as the metal line.

The plurality of buffer portions may be formed in the cavity.

The cap wafer may further comprise a cap sealing line corresponding to a sealing line of the device wafer.

In order to achieve the above aspects, there is provided a fabrication method of a wafer level packaging cap for packaging a device wafer with a device thereon, comprising forming a cavity on one side of the wafer, forming a plurality of connection holes of a certain depth from the other side of the wafer toward the cavity, forming a plurality of buffer portions on the wafer between the cavity and the plurality of connection holes, plating with a metal an inner surface of the plurality of connection holes on the plurality of buffer portions to form connection rods, forming a plurality of cap pads on the other side of the wafer, and forming a plurality of metal lines on one side of the wafer to be electrically connected with the buffer portions.

Forming the cavity comprises forming an oxidized layer on an entire surface of the wafer, forming a pattern corresponding to the cavity on one side of the wafer according to a photolithography, etching away the oxidized layer corresponding to the cavity, and etching away a certain depth of a portion of the wafer having the oxidized layer removed.

Forming the connection holes comprises forming a pattern corresponding to the plurality of connection holes on the other side of the wafer according to the photolithography, etching away a portion of the oxidized layer corresponding to the plurality of connection holes, etching away a certain depth of a portion of the wafer having the oxidized layer removed, and forming the oxidized layer on an inner surface of the plurality of connection holes.

Forming the buffer portion comprises forming a pattern corresponding to the plurality of buffer portions on one side of the wafer according to the photolithography, etching a portion of the wafer corresponding to the plurality of buffer portions to form a groove of a certain pattern in fluid-communication with the connection holes, removing the pattern of the plurality of buffer portions to form the oxidized layer, depositing a seed metal layer on one side of the wafer, and plating with the metal the seed metal to form a plating layer filling the groove of the certain pattern.

Forming the cap pads comprises planarizing the other side of the wafer, depositing a top metal layer on the planarized side of the wafer, forming a pattern corresponding to the plurality of cap pads on the top metal layer, and etching the top metal layer to form a plurality of cap pads.

Forming a cap sealing line on one side of the wafer comprises forming a pattern corresponding to the cap sealing line on one side of the wafer according to the photolithography, depositing a sealing metal on one side of the wafer, removing the pattern of the cap sealing line, and cleaning the wafer.

As described above, if the wafer level packaging cap and the fabrication method thereof according to embodiments of the present invention are applied, the thermal stress between the connection rod and the wafer is reduced due to the buffer operation of the buffer material such that the wafer level packaging cap which is not damaged around the connection rod during the temperature resistance test can be provided.

Additionally, since a buffer portion is formed around a lower portion of the connection hole, it is easy to manufacture the connection hole even if the wafer has a high aspect ratio (HAR). The connection rod can be formed according to the electroplating process since the seed metal can be formed.

BRIEF DESCRIPTION OF THE DRAWINGS

The above and other aspects, features and advantages of the present invention will be more apparent from the following detailed description taken with reference to the accompanying drawings, in which.

DETAILED DESCRIPTION OF THE EXEMPLARY EMBODIMENTS

Figure 1:
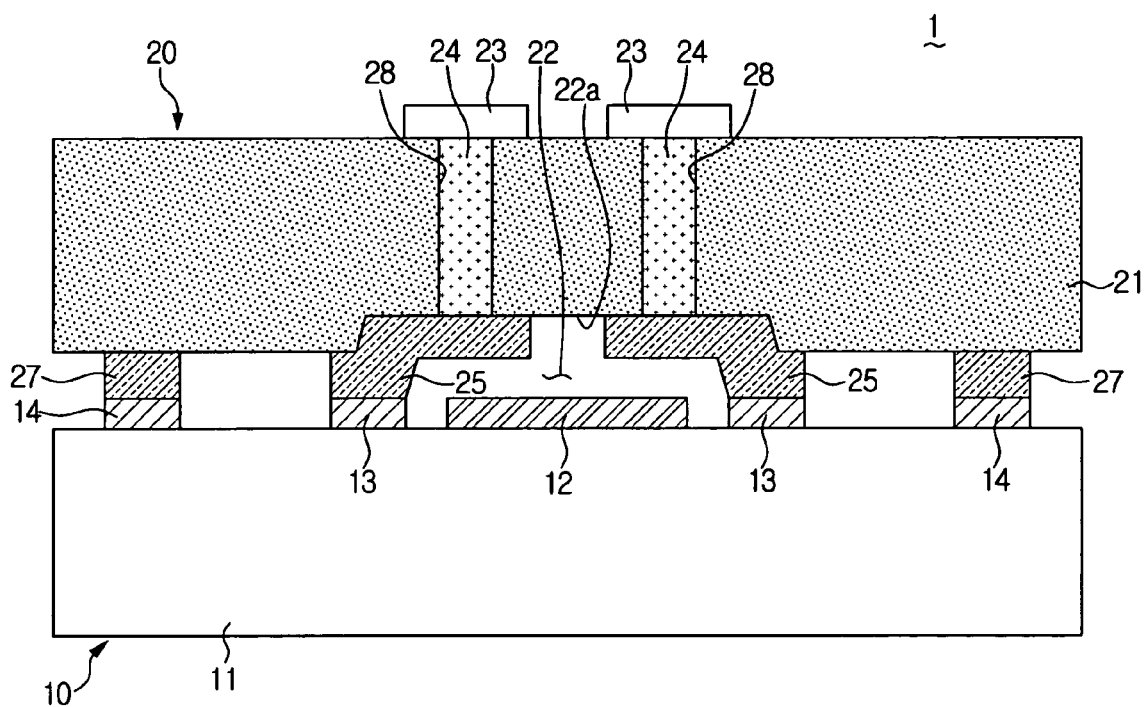
FIG. 1 is a cross-sectional view of a chip packaged with a conventional wafer level packaging cap.

Exemplary embodiments of the present invention will be described in detail with reference to the annexed drawings. In the drawings, the same elements are denoted by the same reference numerals throughout the drawings. In the following description, detailed descriptions of known functions and configurations incorporated herein have been omitted for conciseness and clarity.

Figure 2:
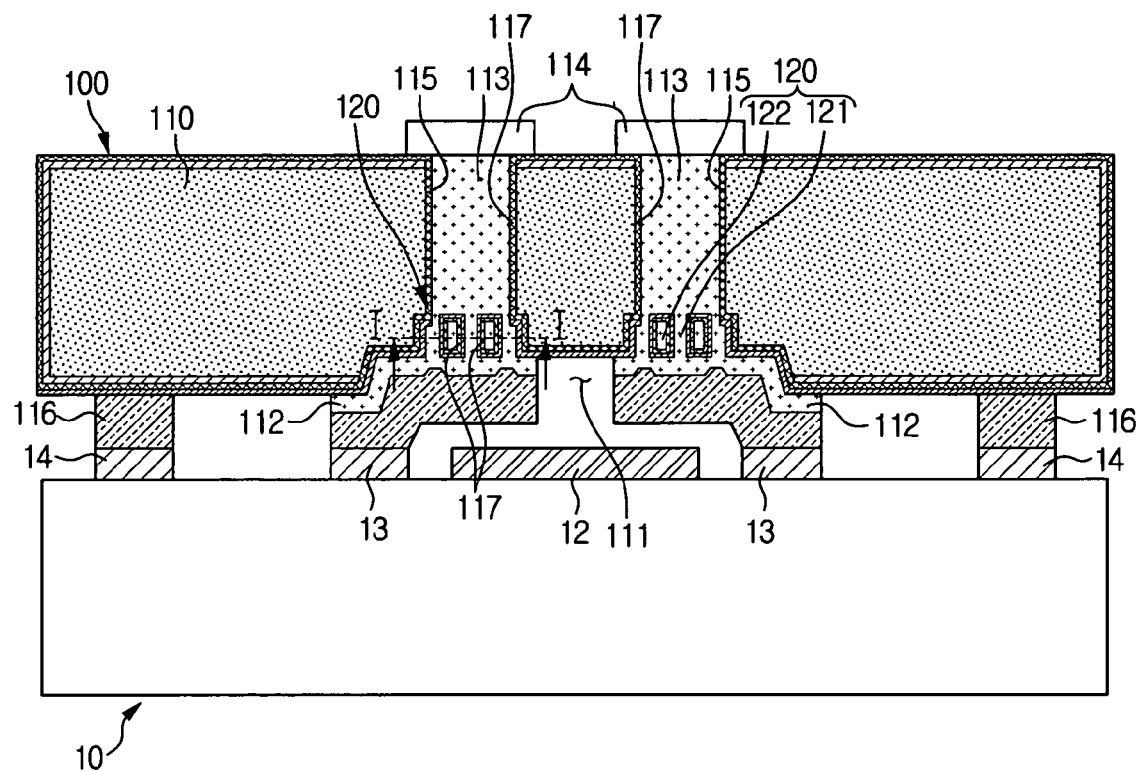
FIG. 2 is a cross-sectional view of a chip packaged with a wafer level packaging cap according to an embodiment of the present invention.

Referring to FIG. 2, a wafer level packaging cap 100 according to an embodiment of the present invention comprises a cap wafer 110, a cavity 111, a plurality of metal lines 112, a plurality of buffer portions 120, a plurality of connection rods 113, a plurality of cap pads 114, and a plurality of cap sealing lines 116.

The cap wafer 110 forms a body of the packaging cap 100, and is integrally combined with a device wafer 10 by solder forming the cap sealing line 116. For the wafer, a material generally used for fabrication of semiconductor may be used, and silicone (Si) wafer is used in the present embodiment.

The cavity 111, formed at a bottom surface of the cap wafer 110, provides a certain volume of space for receiving the device 12 performing a certain function. The size of the cavity 111 depends on the kinds of the device 12 with a certain function formed at the device wafer 10. The cap wafer 110 is etched in a certain shape and depth according to a photolithography process and an etching process to form the cavity 111.

The metal lines 112 are provided with a plurality at the bottom surface of the cap wafer 110 to correspond to a plurality of device pads 13 formed on the device wafer 10 and electrically connected with the device 12. The metal lines 112 electrically connect the connection rods 113 and the device pads 13. An end of the metal line 112 is connected with a bottom surface of the buffer portion 120 and the other end of the metal line 112 is formed at a bottom surface of the cap wafer 110 at a portion contacting the device pads 13 of the device wafer 10.

Figure 3:
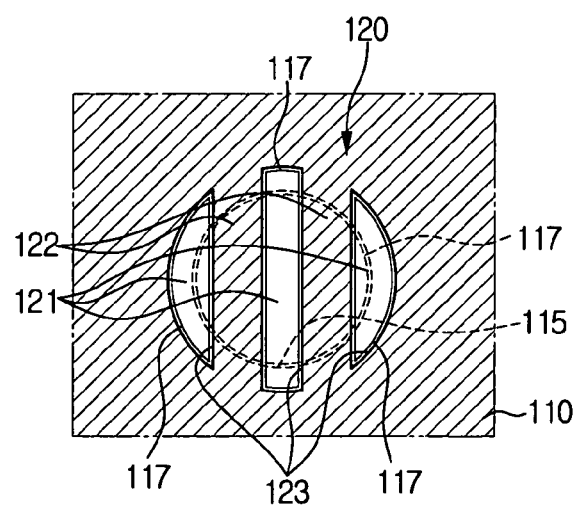
FIG. 3 is a top view of a buffer portion taken on I-I line of the wafer level packaging cap of FIG. 2.

The buffer portion 120 is formed on the cap wafer 110 between the plurality of metal lines 112 and the plurality of connection rods 113 to reduce a stress between the connection rod 113 and the cap wafer 110. The stress is a thermal stress generated due to difference between a strain of the connection rod 113 and a strain of the cap wafer 110 according to a temperature change. It is possible to form the seed metal layer, forming a buffer material layer on an inner surface of the connection hole in the wafer with a thickness of 300 μm or more, due to the buffer portion 120. The buffer portion 120 comprises a buffer wafer 122 forming a plurality of grooves 123 and a metal 121 filled in the plurality of grooves 123 (refer to FIG. 3). The buffer wafer 122 forming the plurality of grooves 123 may be formed to have various patterns when cutting along I-I line of FIG. 2. FIG. 3 is a view of an example of the buffer wafer 122 consisting the buffer portion 120 of the packaging cap 100 according to an embodiment of the present invention. The buffer wafer 122 consisting the buffer portion 120 of FIG. 3 has a stripe pattern, and the plurality of grooves 123 are filled with the metal 121. A buffer material layer 117 is formed between the buffer wafer 122 forming the plurality of grooves 123 and the metal 121 filling the plurality of grooves 123 to absorb the thermal stress generated between the silicone and the metal. The buffer material layer 117 may be formed as an oxidized layer. The buffer material layer 117 is formed on side walls of the plurality of grooves 123 and may have a thickness of 0.5~1 μm. The stripe pattern of the buffer wafer 122 of the buffer portion 120 as shown in FIG. 3 is merely an example. Various alternative patterns for preventing the metallic connection rod 113 from coming out of the connection hole 115 formed with the silicone wafer, such as a lattice pattern, will come to mind to a person skilled in the art. The metal filling the plurality of grooves 123 of the buffer portion 120 electrically connects the metal line 112 and the connection rod 113, and may be formed with the same material as the metal forming the metal line 112. As shown in FIG. 3, the buffer portion 120 is formed to be greater than the connection hole 115 in cross-section. However, the cross-section of the buffer portion 120 may be less than the size of 1.3 times of a diameter of the connection hole 115. The buffer portion 120 may have a height of less than approximately 100 μm.

The plurality of the connection rods 113 are made from a metal, and electrically connect the metal lines 112 and the cap pads 114 on the cap wafer 110 via the metal 121 of the buffer portion 120. The buffer material layer 117 is formed between the cap wafer 110 and the connection rod 113 to absorb the thermal stress generated between the silicone and the metal. The buffer material layer 117 may be formed as an oxidized layer. The connection hole 115 is formed in a certain depth to fluidly communicate from the top surface of the cap wafer 110 to the buffer portion 120, the buffer material layer 117 is formed on the inner surface of the connection hole 115, and then the metal is electroplated in order to form the connection rod 113.

The cap pad 114 electrically connects the device 12 covered with the packaging cap 100 to an external apparatus, and is provided with a plurality which corresponds to the number of the device pads 13 on the device 12. The cap pads 114 are electrically connected to the upper portion of the connection rods 113 of the plurality of connection holes 115 on the cap wafer 110.

The cap sealing line 116, formed around the cavity 111 on the bottom surface of the cap wafer 110, is combined with the sealing line 14 of the device wafer 10 for sealing so as to protect the device 12 in the cavity 111 from entering of moisture or particles. The metal material, used as the sealing material, which is solder, and forming the cap sealing line 116, is melted, fused and sealed with the sealing material forming the sealing line 14 of the device wafer 10 at a predetermined heat. The solder material of the cap sealing line 116 is not an important part in the present invention, and well-known solder can be used therefor, and thus, detailed description thereof will be omitted.

The packaging cap 100 covers the device 12 by having the cap sealing line 116 of the packaging cap 100 align with the sealing line 14 of the device wafer 10 with the device 12 performing a certain function thereon, and then the heat is added to melt the sealing material, solder, forming the sealing lines 14, 116 such that the sealing lines 14, 116 of the device wafer 10 and the packaging cap 100 are adhered to each other and the wafer level packaging is completed.

The fabrication method of the wafer level packaging cap according to an embodiment of the present invention will be described hereinafter.

The fabrication method of the Wafer level packaging cap comprises the steps of: forming the cavity 111 at one side of the wafer; forming the plurality of connection holes 115 from the opposite side of the wafer with the cavity toward the cavity 111 in a certain depth, forming a plurality of the buffer portions 120 on the wafer between the cavity 111 and the plurality of connection holes 115, metal-plating the inner surface of the plurality of connection holes 115 to form the connection rods 113 on the plurality of buffer portions, forming a plurality of cap pads 114 on the opposite surface of the wafer, and forming at the one side of the wafer a plurality of metal lines 112 electrically connected to the buffer portions 120.

Figure 4A:
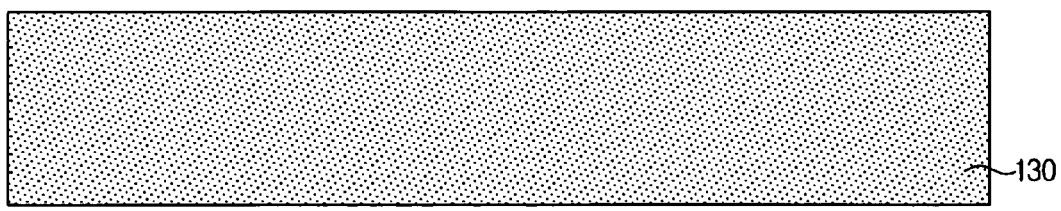
FIGS. 4A through 4V are views of fabrication method of the wafer level packaging cap according to an embodiment of the present invention.

One embodiment of the fabrication method of the wafer level packaging cap will be explained with references to the accompanying FIGS. 4A through 4V.

A wafer 130 (FIG. 4A) is provided to form the cap wafer 110 by manufacturing the cavity 111, a plurality of buffer portions 120, and the connection holes 115

Figure 4B:
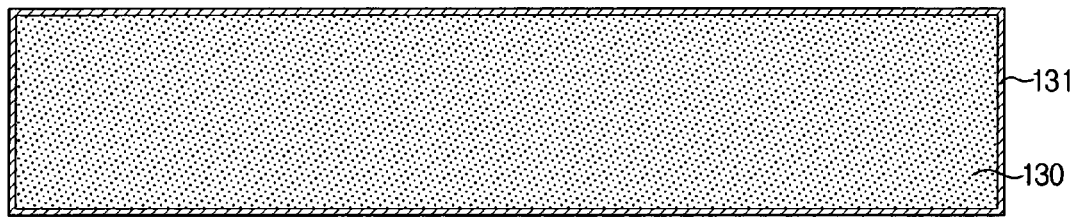

The entire surface of the wafer 130 is oxidized with a first oxidized layer 131 (FIG. 4B).

Figure 4C:
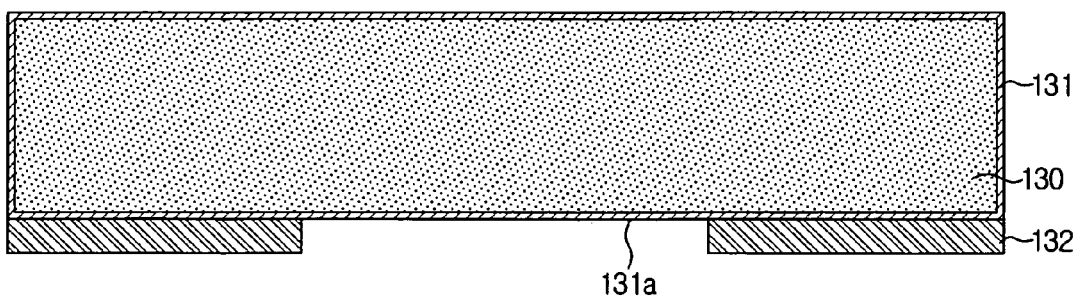

A pattern 132 corresponding to the cavity 111 is formed on one side of the wafer 130 according to a photolithography (FIG. 4C). The photolithography is a process in which a photosensitive film is formed with a photoresist on one side of the wafer 130, a mask with a necessary pattern is covered on the photosensitive film, light, such as ultraviolet rays, is emitted and developed so that the photosensitive film part corresponding to the pattern capable of forming a necessary shape can be left. In the following explanation of the fabrication method, the photolithography is used for the same and similar meaning.

Figure 4D:
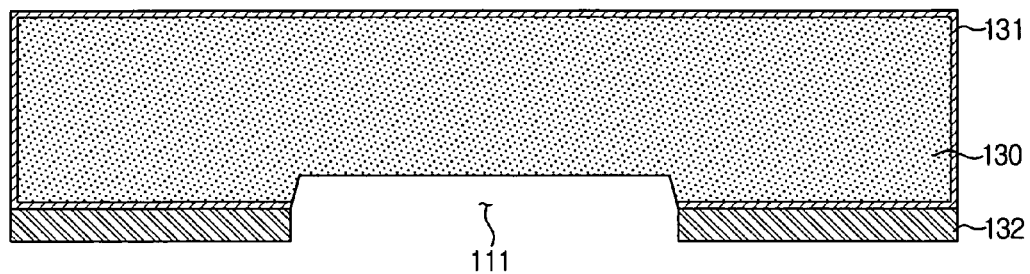

A part 131a of the oxidized part corresponding to the cavity 111 is etched away, and a part of the wafer having the oxidized layer removed is etched away in a certain depth according to wet silicone etching so that the cavity 111 with a certain area and depth can be formed (FIG. 4D).

Figure 4E:
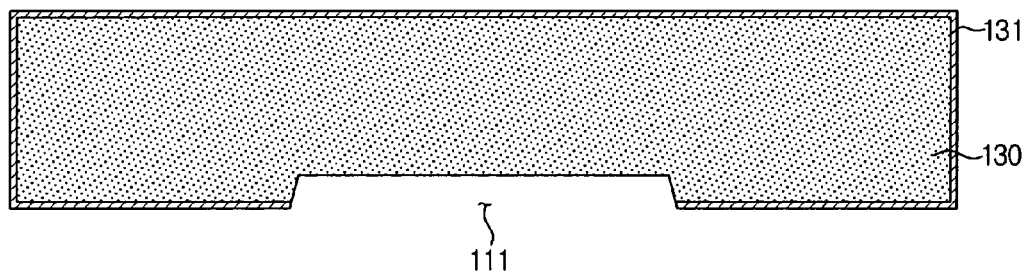

The photosensitive film 132 forming the pattern of the cavity 111 is removed and then cleaned (FIGS. 4D and 4E).

Figure 4F:
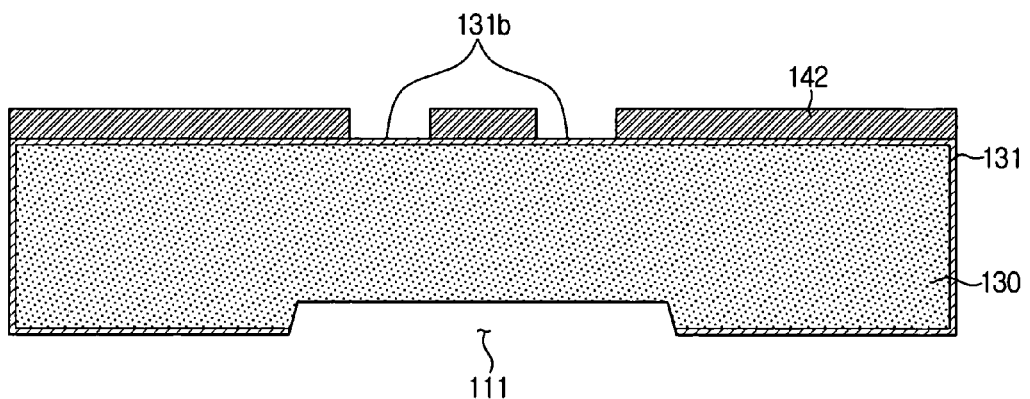

A pattern 142 is formed corresponding to a plurality of connection holes 115 opposite to the side on which the cavity 111 is formed, according to the photolithography (FIG. 4F).

Figure 4G:
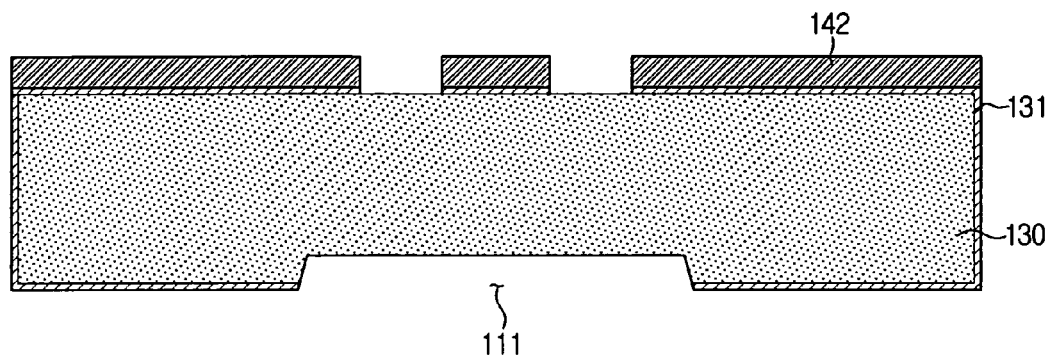
Figure 4H:
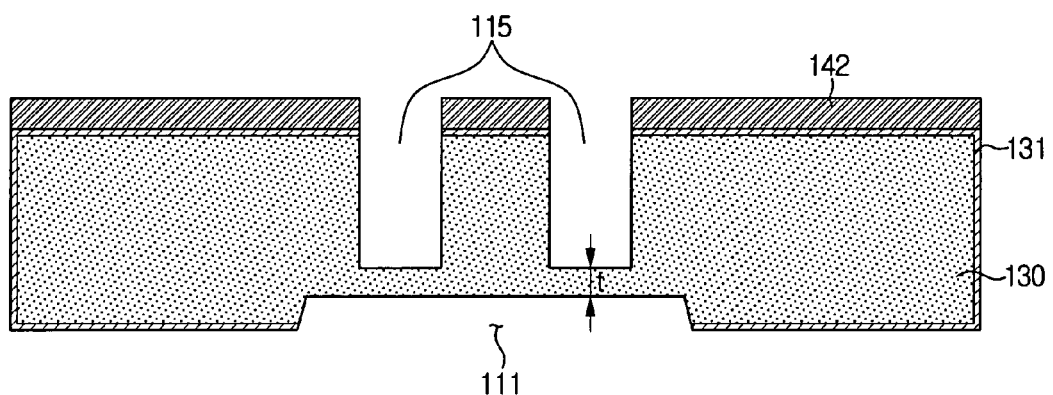

A part 131b of the first oxidized layer is etched away on portions corresponding to a plurality of connection holes 115 (FIG. 4G). Then, a plurality of connection holes 115 are formed on the wafer 130 in a certain depth according to the silicone etching (FIG. 4H). As the plurality of connection holes 115 are formed, the thickness t of the wafer 130 between bottom portions of the connection holes 115 and the cavity 111 should be a minimum thickness capable of functioning as the buffer portion 120. Accordingly, the thickness t of the portion to be formed with the buffer portion 120 may be less than 100 μm. The plurality of connection holes 115 may be etched according to a dry etching which etches the silicone wafer 130 by using Inductively Coupled Plasma Reactive Ion Etching (ICP-RIE) system.

Figure 4I:
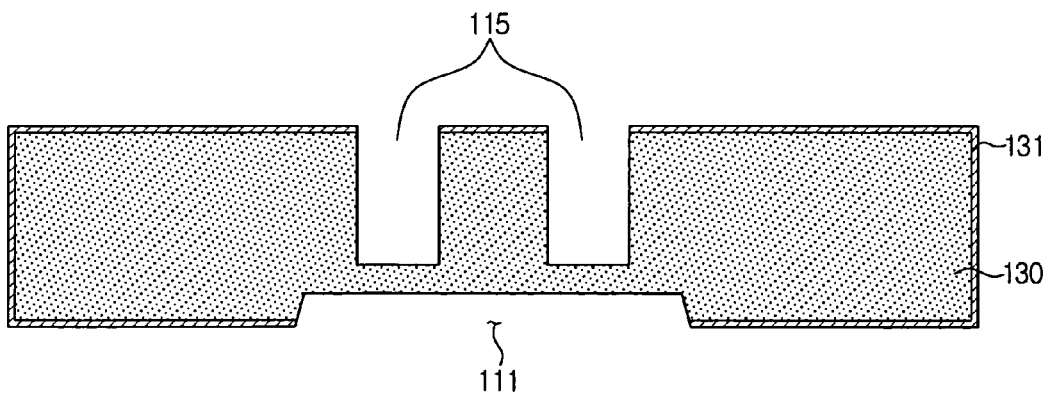

The photosensitive film forming the pattern 142 corresponding to the plurality of the connection holes 115 is removed (FIGS. 4G and 4I).

Figure 4J:
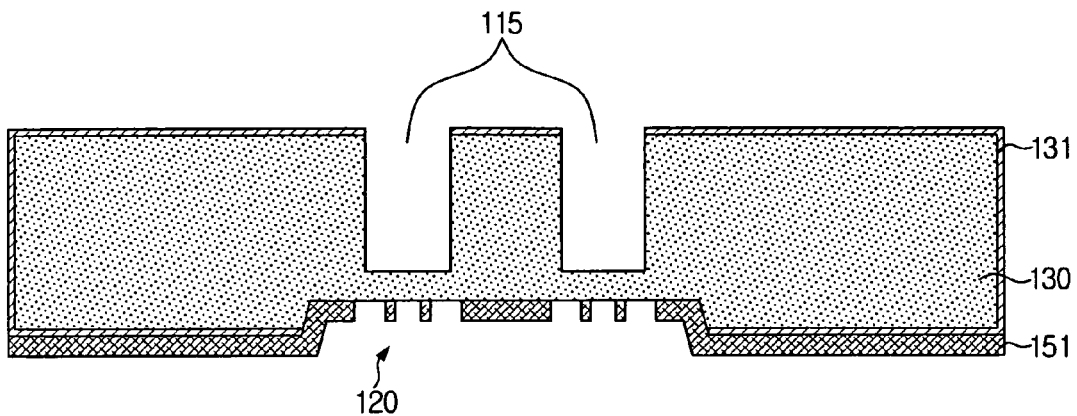

A pattern 151 is formed on the wafer surface with the cavity 111 (hereinafter, a bottom surface of the wafer) according to the photolithography, and the pattern 151 corresponds to the plurality of buffer portions 120 (FIG. 4J).

Figure 4K:
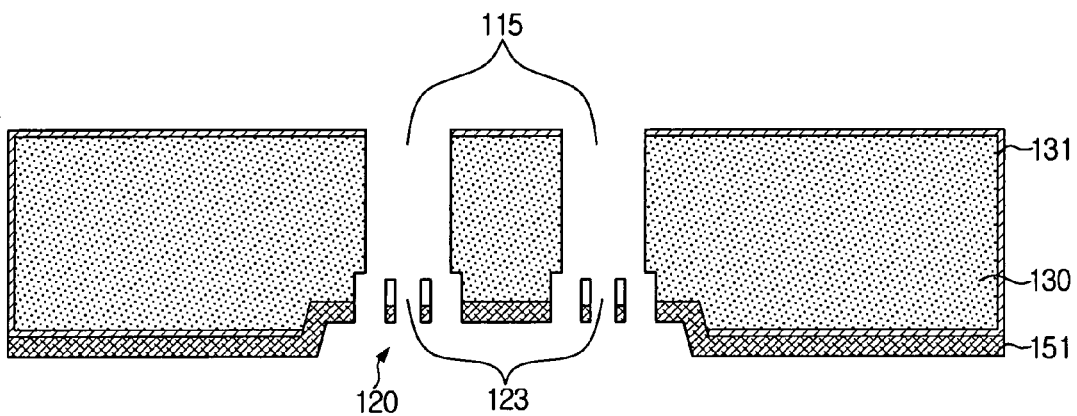

The plurality of buffer portions 120 are provided in forms of the plurality of grooves 123 (refer to FIG. 3) with a certain pattern according to the silicone etching (FIG. 4K). The plurality of grooves 123 forming each of the buffer portions 120 are etched in a sufficient depth to fluidly communicate with the connection holes 115 formed on the opposite side of the wafer 130.

Figure 4L:
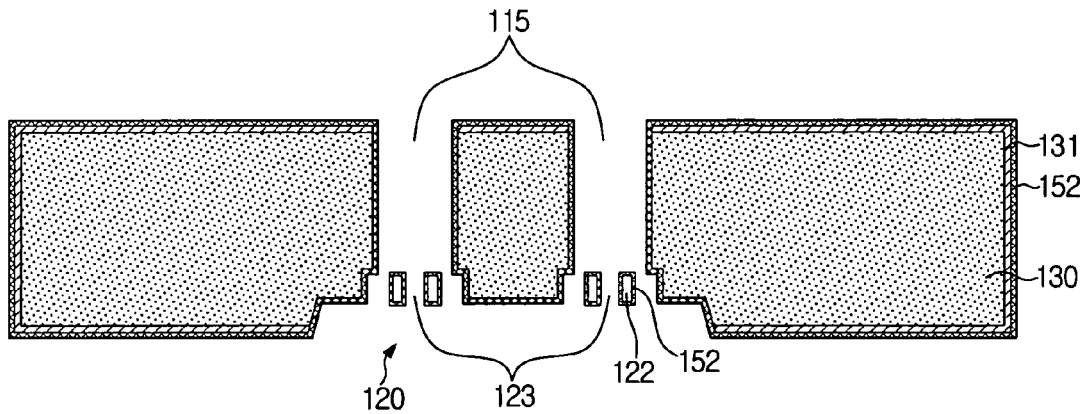

The photosensitive film which forms the pattern 151 corresponding to the buffer portion 120 is removed and cleaned. The wafer 130 which includes the cavity 111, the plurality of connection holes 115, and the groove 123 of the buffer portion 120 is oxidized to form the second oxidized layer 152 (FIG. 4L). The second oxidized layer 152 functions as the buffer material layer 117 (refer to FIG. 2). The second oxidized layer 152 is formed on the side wall of the buffer wafer 122 forming the plurality of grooves 123 of the buffer portion 120 and the inner surface of the connection hole 115, and the thickness is around 0.5~1 μm. An oxidized layer is formed on the cavity 111, the inside of the plurality of connection holes 115, and the groove 123 of the buffer portion 120, which have the first oxidized layer 131 removed, such that the thermal stress between the silicone 122 and the metal 121 can be buffered.

Figure 4M:
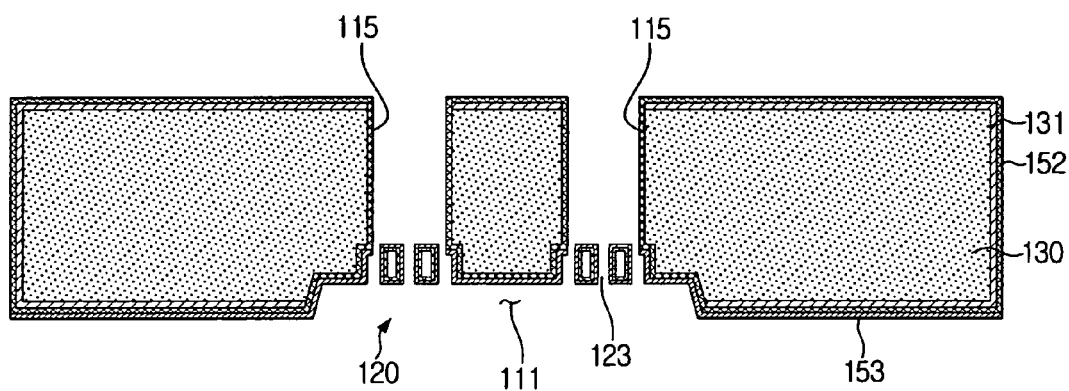

The seed metal is deposited on the bottom surface of the wafer 130 with the cavity 111 to form a seed metal layer 153 (FIG. 4M). The seed metal layer 153 fills the plurality of grooves 123 of the buffer portion 120 by electroplating, and is formed on the inner surface of the plurality of grooves 123 of the buffer portion 120.

Figure 4N:
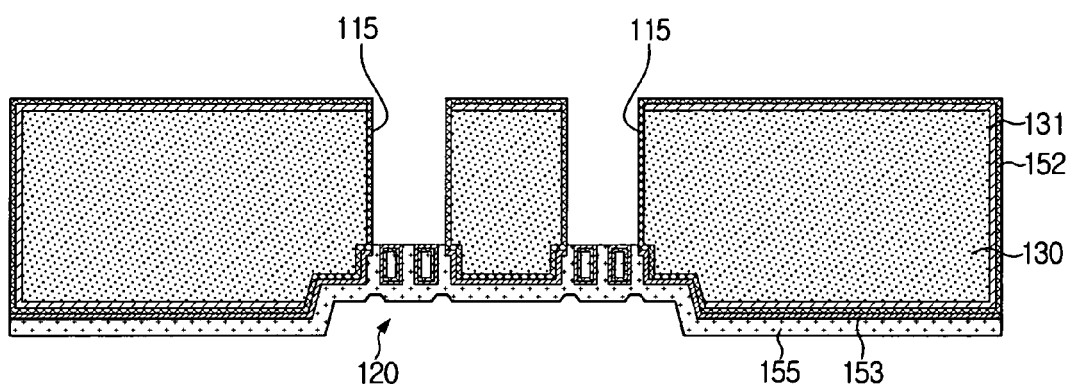

The seed metal layer 153 on the bottom surface of the wafer 130 is electroplated, and a metal is deposited thereon to form a first plating layer 155 (FIG. 4N) (This is called a first electroplating process). At this time, the electroplating should be performed for the metal of the first plating layer 155 deposited according to the electroplating to completely fill the grooves 123 of the plurality of buffer portions 120.

Figure 4O:
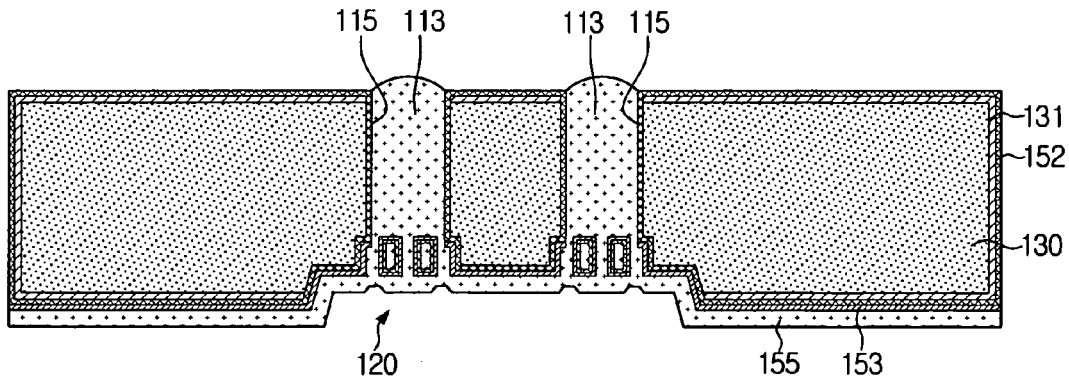

As the first electroplating process is completed to fill the plurality of the grooves 123 of the buffer portion 120, a second electroplating is for filling a plurality of the connection holes 115 with a metal to form a plurality of connection rods 113 (FIG. 4O). Generally, height of the plurality of connection rods 113 formed by the electroplating is not identical. This is because the inner surface of the connection hole 115 is irregular as the silicone (Si) wafer 130 is etched to form the connection holes 115. Accordingly, as the metal is deposited on the plurality of connection holes 115 according to the electroplating to form the plurality of connection rods 113, height of the top portion of the plurality of connection rods 113 is different.

Figure 4P:
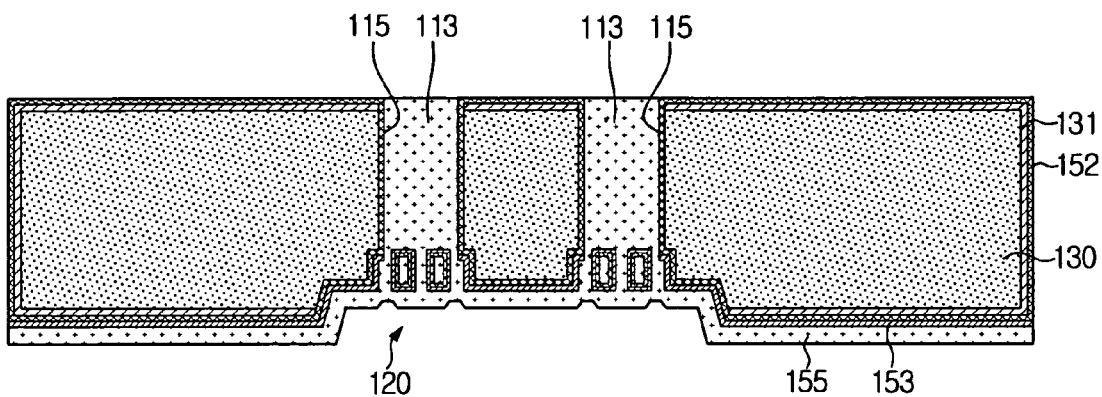

As the second electroplating process for forming the connection rod 113 is completed, the surface of the wafer 130 with the plurality of connection holes 115 (hereinafter, the top surface of the wafer) is planarized for the top portion of the plurality of connection rods 113 to align with the top surface of the wafer 130 (FIG. 4P). Lapping or Chemical Mechanical Polishing (CMP) system is used for the planarization process.

Figure 4Q:
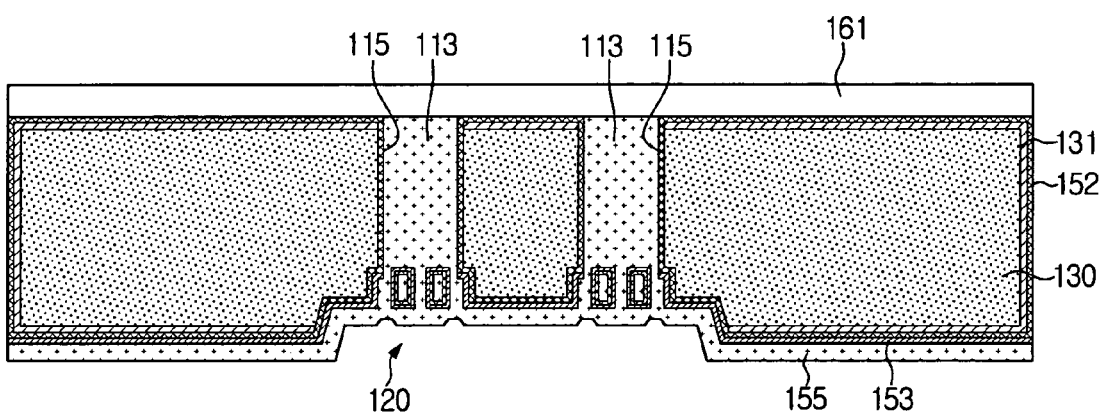

The metal forming the cap pad 114 is deposited on the top surface of the wafer 130 to form a top metal layer 161 (FIG. 4Q).

Figure 4R:
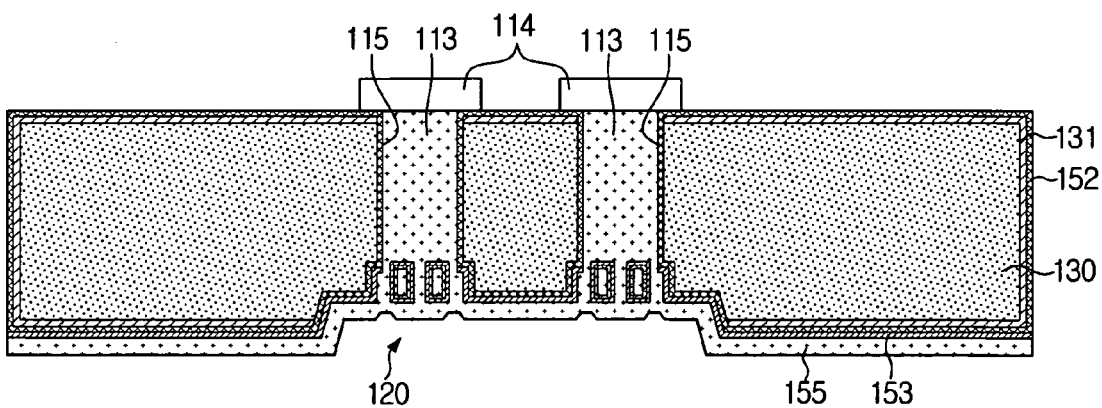

A pattern is formed on the top metal layer 161 according to the photolithography to form a plurality of cap pads 114 (not shown). The top metal layer 161 is etched, and the photosensitive film forming the pattern of the cap pads 114 is cleaned to complete the plurality of cap pads 114 (FIG. 4R).

Figure 4S:
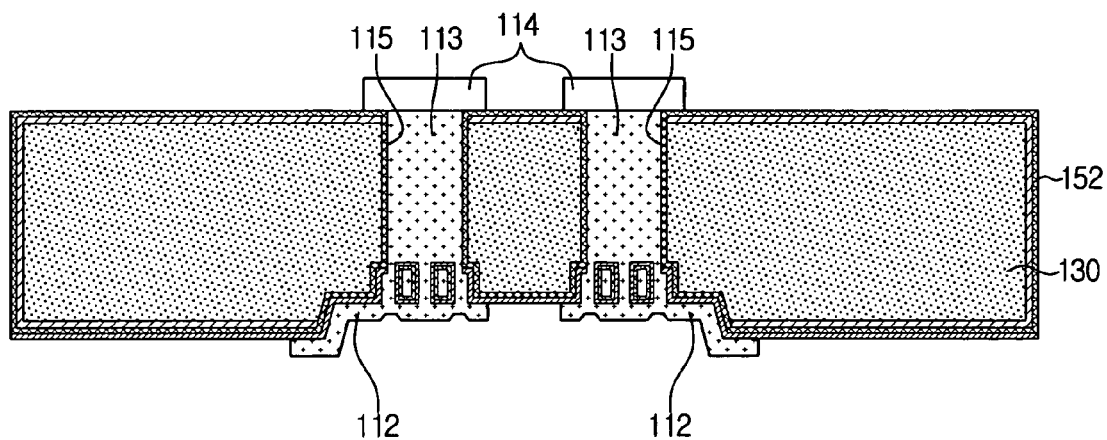

A pattern corresponding to the plurality of metal lines 112 is formed according to the photolithography on the first plating layer 155 of the bottom surface of the wafer 130 formed according to the first electroplating process (not shown). The first plating layer 155 is etched, and then the photosensitive film forming the pattern of the plurality of metal lines 112 is removed to complete the plurality of metal lines 112 (FIG. 4S).

Figure 4T:
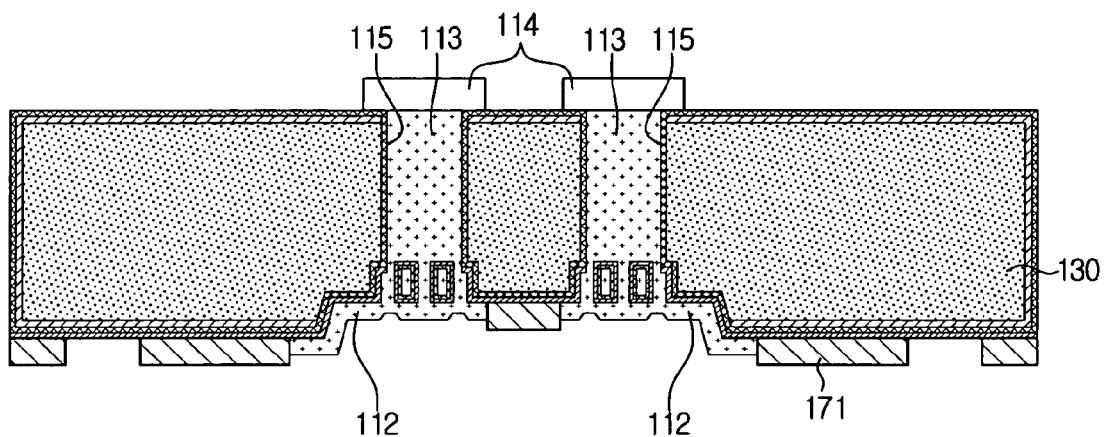
Figure 4U:
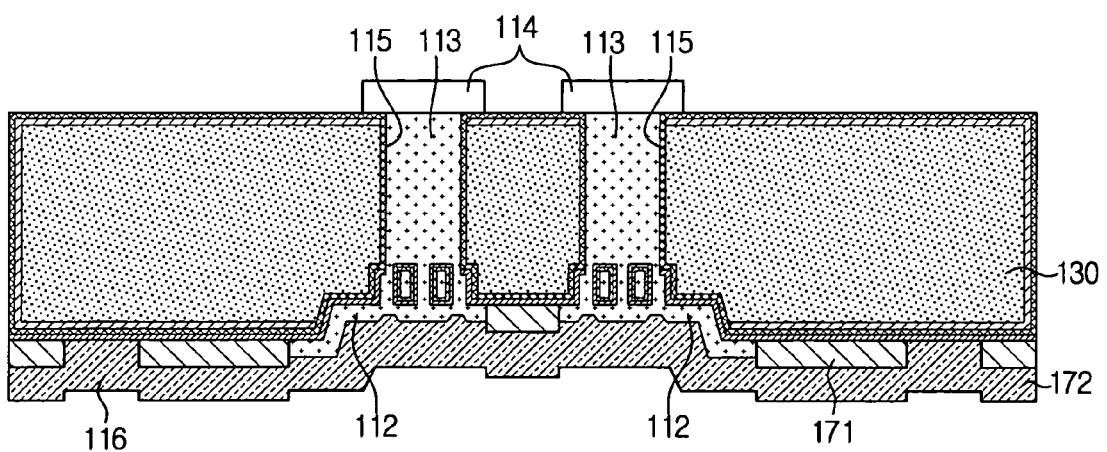
Figure 4V:
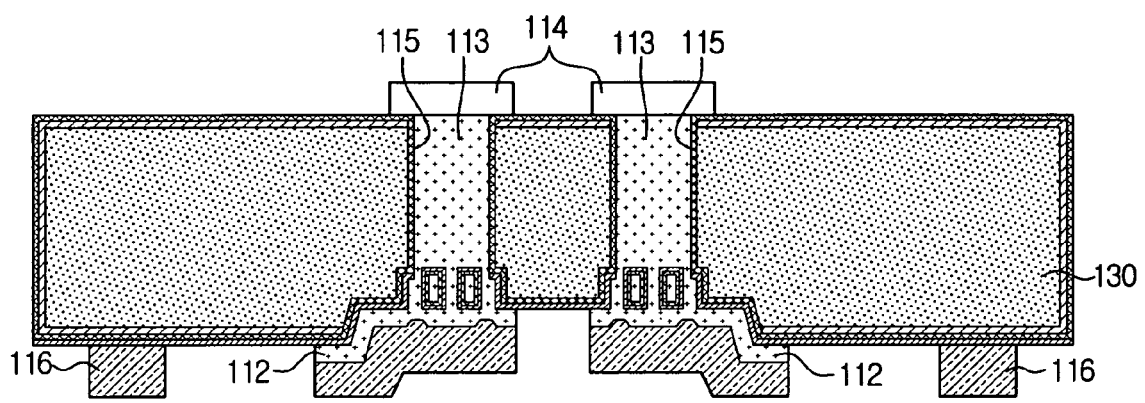

A pattern 171 corresponding to the cap sealing line 116 is formed on a bottom surface of the wafer 130 according to the photolithography (FIG. 4T). The sealing material (solder) forming the cap sealing line 116 is deposited on the bottom surface of the wafer 130 to form the sealing layer 172 (FIG. 4U). The sealing material of the sealing layer 172 of unnecessary portions and the photosensitive film 171 forming the pattern corresponding to the cap sealing line 116 are removed to complete the packaging cap (FIG. 4V). At this time, the lift-off process may be applied which can together remove the photosensitive film 171 and the sealing material 172.

While the invention has been shown and described with reference to certain embodiments thereof, it will be understood by those skilled in the art that various changes in form and details may be made therein without departing from the spirit and scope of the invention as defined by the appended claims.

What is claimed is:

1. A wafer level packaging cap for covering a device wafer with a device thereon, comprising:
    a cap wafer having on a bottom surface a cavity;
    a plurality of metal lines formed on the bottom surface of the cap wafer to correspond to a plurality of device pads formed on the device wafer to be electrically connected to the device;
    a plurality of connection rods penetrating the cap wafer from a top surface of the cap wafer to the cavity;
    a plurality of buffer portions disposed within a bottom end of each of the connection rods, the plurality of buffer portions not extending to the top surface of the cap wafer; and
    a plurality of cap pads formed on the top surface of the cap wafer and electrically connected to the plurality of connection rods.

2. The wafer level packaging cap according to claim 1, further comprising a buffer material layer formed around the plurality of buffer portions.

3. The wafer level packaging cap according to claim 2, wherein the buffer material layer is an oxidized layer.

4. The wafer level packaging cap according to claim 1, wherein the bottom ends of the connection rods are wider than top ends of the connection rod in cross-section.

5. The wafer level packaging cap according to claim 1, wherein the buffer portions form a stripe pattern in cross-section.

6. The wafer level packaging cap according to claim 1, wherein a metal of the connection rods is the same material as the metal lines.

7. The wafer level packaging cap according to claim 1, wherein the plurality of buffer portions are adjacent to the cavity.

8. The wafer level packaging cap according to claim 1, wherein the cap wafer further comprises a cap sealing line corresponding to a sealing line of the device wafer.

\* \* \* \* \*